United States Patent [19]

Chennakeshu et al.

[11] Patent Number: 5,311,553
[45] Date of Patent: May 10, 1994

[54] TRELLIS CODING TECHNIQUE TO INCREASE ADJACENT CHANNEL INTERFERENCE PROTECTION RATIO IN LAND MOBILE RADIO SYSTEMS UNDER PEAK POWER CONSTRAINTS

[75] Inventors: Sandeep Chennakeshu; Rajaram Ramesh, both of Schenectady; Amer A. Hassan, Clifton Park; John B. Anderson, Latham, all of N.Y.

[73] Assignee: General Electric Company, Schenectady, N.Y.

[21] Appl. No.: 975,201

[22] Filed: Jun. 15, 1992

[51] Int. Cl.$^5$ ............................................. H04L 5/12
[52] U.S. Cl. ........................................ 375/39; 375/53; 375/57; 375/60; 375/67; 375/85; 375/94; 332/103; 329/304
[58] Field of Search ............... 375/58, 39, 49, 57, 375/52, 60, 94, 95, 67, 83, 85, 52, 53, 67, 83, 85; 455/50, 63; 332/103; 329/304

[56] References Cited

U.S. PATENT DOCUMENTS 5,164,963 11/1992 Lawrence et al. .................. 375/39

OTHER PUBLICATIONS

Abstract—Norihito Kinoshita and Seiichi Sampei (Authors), "Method of Rejecting Adjacent Channel Interference using an Adaptive Equalizer", May 1988.

Primary Examiner—Curtis Kuntz
Assistant Examiner—Tesfaldet Bocure
Attorney, Agent, or Firm—Lawrence P. Zale; Marvin Snyder

[57] ABSTRACT

An optimum communication system employs an encoder coupled to a mapper and two parallel branches, each branch having a transmit filter a digital-to-analog converter, a low pass filter and a modulator coupled in series. Both modulators are coupled to a summer which provides an rf signal to a transmit antenna. A second antenna is coupled to a first down converter, an IF filter, a second down converter, an analog-to-digital converter and a decoder. The encoder is optimized by choosing a desired minimum Euclidean distance between symbols multiplied by the average to peak transmit power ratio (MPDR), an encoder alphabet and a number of constellation points. All possible encoder states and all possible input symbols are permutated to result in a plurality of encoder sets. The minimum distance between coded symbols and a $P_{ib}/P_{ab}$ power ratio for each code set is determined. The encoder is adapted to output an encoder set U having a largest $P_{ib}/P_{ab}$ power ratio having a large adjacent channel interference protection ratio. In an alternative embodiment, a minimum $P_{ib}/P_{ab}$ power ratio (MPR) is chosen. The encoder is adapted to output an encoder set U having the largest minimum distance between coded symbols multiplied by the average to peak transmitted power ratio, that also has a $P_{ib}/P_{ab}$ ratio that exceeds MPR.

3 Claims, 8 Drawing Sheets

TRELLIS CODING TECHNIQUE TO INCREASE ADJACENT CHANNEL INTERFERENCE PROTECTION RATIO IN LAND MOBILE RADIO SYSTEMS UNDER PEAK POWER CONSTRAINTS

CROSS REFERENCES TO RELATED APPLICATIONS

This application is related to U.S. patent application Trellis Coding Technique to Improve ACIPR in Land Mobile Radio Systems Under Peak Power Constraints Ser. No. 07/898,670 by Sandeep Chennakeshu, Amer A. Hassan and John B. Anderson assigned to the present assignee, hereby incorporated by reference, and filed simultaneously with this application.

BACKGROUND OF THE INVENTION

1. Field of the Invention

This invention relates to land mobile radio systems and more specifically to minimizing adjacent channel interference for land mobile radio systems.

2. Description of Related Art

Conventional land mobile radio (LMR) channels employ narrow-band frequency division multiplexed (FDMA) systems with different radio units assigned to different frequency bands. These bands are typically 25 KHz wide. There is an immediate need for an increase in capacity of LMR systems in the U.S. for such applications as public safety trunking. The trend is to increase capacity by splitting each existing 25 KHz channel used in LMR systems into two 12.5 KHz channels. However, this causes adjacent channel interference (ACI). ACI is interference introduced at a receiver from a transmitter broadcasting at a frequency corresponding to an adjacent channel and this is sometimes called adjacent channel 'splatter'.

In a typical LMR system, communication between mobile units takes place through a base unit (base station). Each base station serves a certain geographic area. Communication between mobile units and base units takes place on a pair of frequencies that are separated, usually widely, to prevent interference. One frequency is needed for base to mobile communication and the other frequency in the pair is used for mobile to base communication. In some situations, mobile units can communicate with each other directly without going through the base unit. This is called "Talk-Around". A pair of frequencies are also used in Talk Around communications, one for each direction.

A problem occurs if two mobile units employ spectrally adjacent frequencies to communicate with their base units. Usually, mobile units within the same area will not be assigned spectrally adjacent frequencies but mobile units in contiguous geographic areas can use spectrally adjacent frequencies. The same situation exists with respect to frequency assignments to base units.

A measure of the acceptable level of ACI in a system is an ACI protection ratio (ACIPR). ACIPR is defined as the amount, in decibels, that the power of the interferer can be increased relative to the power of the desired signal, until a certain performance threshold is reached. For LMR system the bit error rate (BER) is used as an appropriate measure of performance. For analog FM, the ACIPR is specified to be in the range of 65-70 dB. Some digital modulation schemes offer adequate spectral efficiency but lower ACIPR (in the range of 45-50 dB). The ACIPR values may be augmented by several techniques. However, the problem gets increasingly difficult as the need for capacity and higher spectral efficiency arises.

Some of the commonly adopted techniques to improve ACIPR for digital modulation are antenna diversity in which more than one antenna receives a signal and the receiver chooses the signal from the antenna having a better signal strength. Antenna diversity is useful in providing a margin of 3-5 dB in ACIPR. Antenna diversity is further described in *Characterizing the Effects of Nonlinear Amplifiers on Linear Modulation for Digital Portable Radio Communications*, by S. Ariyavisitakul and T. P. Liu, IEEE Transactions on Vehicular Technology, Vol. 39, No. 4, pp. 383-389, November 1990.

Another technique to improve ACIPR is interference rejection and cancellation where an estimator is employed in estimating what a signal should be, and subtracting the estimated signal from the actual signal to synthesize an interference signal which is then subtracted from the further received signals. A similar technique is interference rejection using filtering described in *Rejection Method of Adjacent Channel Interference for Digital Land Mobile Communications*, by S. Sampei and M. Yokohama, The Transactions of the IECE of Japan, Vol. E 69, No. 5, pp. 578-580, May 1986. Interference cancellation is described in *Method of Rejecting Adjacent Channel Interference Using an Adaptive Equalizer*, by N. Kinoshita and S. Sampei, Transactions of IEICE (section B), J71-B, 10, pp. 1119-1126, October 1988. Interference rejection and cancellation involves complex receiver circuitry and is highly dependent upon the channel conditions and interference power. These techniques can provide up to 6-10 dB of gain if properly implemented.

Transmitter power control is described by Y. Nagata and Y. Akaiwa in *Analysis for Spectrum Efficiency in Single Cell Trunked and Cellular Mobile Radio*, IEEE Transactions on Vehicular Technology, Vol. VT-35, No. 3, pp. 100-113, August 1987. Transmitter power control offers a larger gain (10-15 dB) in ACIPR by controlling the transmit power of mobile stations. In transmitter power control, the mobile units which are closer to the base station transmit at a lower power in order not to "splash" other mobile units. The base station power is not varied. This scheme is complex and the complexity increases with capacity.

Another commonly suggested approach to providing higher spectral efficiency in a LMR channel is to use Trellis Coded Modulation (TCM) as described in *Channel Coding with Multilevel/Phase Signals*, by G. Ungerboeck, IEEE Transactions on Information Theory, Vol. IT-28, No. 1, pp. 55-67, January 1982. A typical TCM scheme employing Ungerboeck codes is designed to maximize the separation between transmitted signal states, called the Euclidean distance. However, optimization of Euclidean distance need not improve ACIPR.

A technique for designing trellis codes for band-limited channels is described in *Bandwidth-Efficient Trellis Coded Modulation Schemes*, by S. Ramseier, Proceedings of the International Conference on Communications, pp. 1517-1521, 1990. This technique designs Trellis Codes based on optimizing the normalized in-band power. This optimization is not as important for an LMR system since normalized in-band power does not maximize ACIPR. And further, the optimization as described by Ramseier does not consider the effects of the receive filter characteristics, which has a critical influence on ACIPR.

A related problem is that bandwidth saving is typically achieved at the expense of power and hence range reduction. The range reduction can be quite a problem where the area over which the base unit and mobile unit communicate is very large. An increased transmission area implies increased cost and complexity at the base station. Therefore, there is a need to find a spectrally efficient modulation scheme that has high ACIPR and offers a transmit range comparable to existing analog FM systems.

OBJECTS OF THE INVENTION

An object of the present invention is to provide a communication system having high spectral efficiency and a high channel capacity.

Another object of the invention is to provide a method of communication having an increased adjacent channel interference protection ratio (ACIPR) relative to conventional techniques such as quadrature phase shift keying (QPSK).

Another object of the invention is to provide a method of communication having superior peak transmitted power to average transmitted power ratio as compared with a conventional scheme such as QPSK while still providing a required adjacent channel interference protection ratio (ACIPR).

SUMMARY OF THE INVENTION

A method of constructing a system for communicating on adjacent frequency bands with minimal interference between adjacent channels comprises optimizing an encoder that is serially connected to two parallel processing branches, each including a transmit filter, a digital-to-analog (D/A) converter, a low pass filter and a modulator. The encoder is optimized by first choosing an encoder alphabet and a number of constellation points. All possible encoder states and all possible input symbols are permutated to produce a plurality of encoder sets U. The minimum distance value between encoder sets, and peak to average power ratio $P_{peak}/P_{ave}$ is determined for each set U. A power to distance ratio $P_{DR}$ is determined from the minimum distance value between encoder sets, and peak to average power ratio $P_{peak}/P_{ave}$. A desired minimum power to distance ratio (MPDR) defined as the minimum distance between encoder sets U divided by the peak power to average power ratio. Code sets U having $P_{DR}$ values lower than MPDR are discarded. The encoder produces the signal from the code set of the remaining sets having the largest in-band to adjacent band power ratio $P_{ib}/P_{ab}$. The encoder signal is transmitted to a receiver resulting in a signal having a spectrum that maximizes the ratio of in-band to adjacent band power for LMR systems. Maximizing the in-band to adjacent-band power increases ACIPR and also allows for increased data transmission rates. The transmitted signal is then decoded at the receiver.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing in which:

FIG. 2b is a diagram of overlapping frequency spectra of three adjacent LMR channels confined to the bandwidth of FIG. 2a.

FIG. 4b is a diagram of a frequency spectrum of a shaped transmitted signal superimposed on the idealized receive filter magnitude response (receive window) of FIG. 4a.

DETAILED DESCRIPTION OF THE INVENTION

Figure 1:
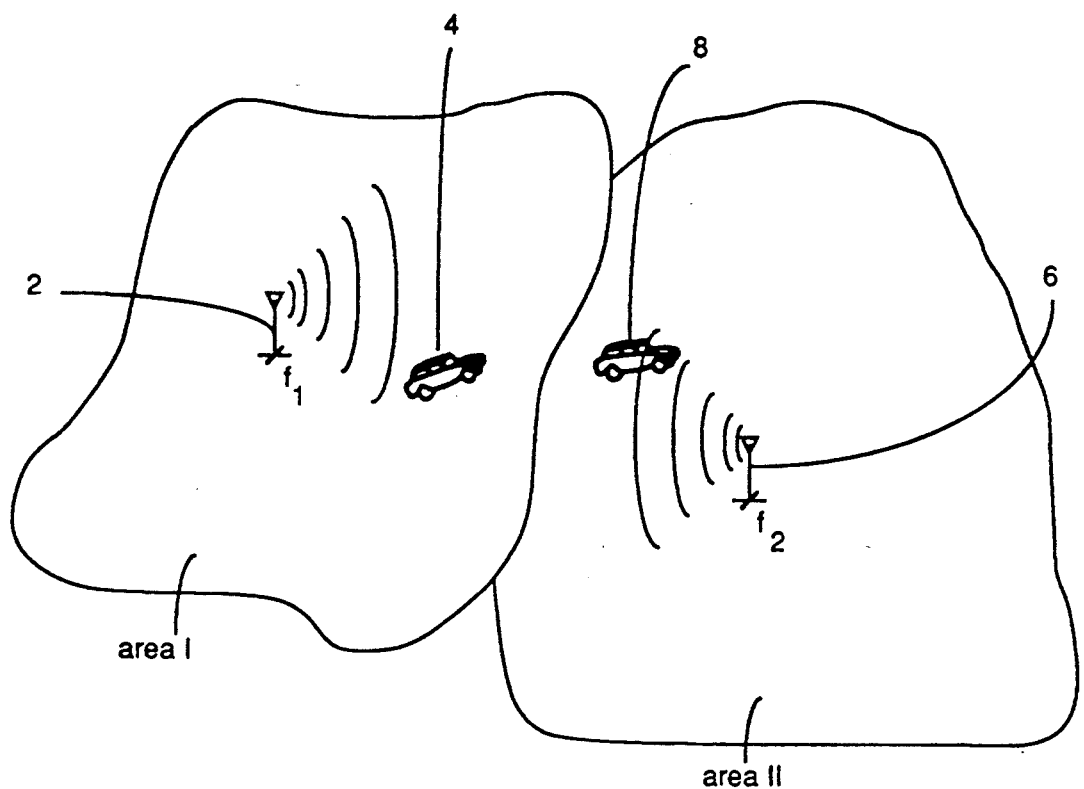
FIG. 1 is an illustration of two LMR systems communicating in geographically adjacent areas using adjacent frequency bands.

Typically, in LMR systems, contiguous geographic areas can use spectrally adjacent channels. In FIG. 1, area I and area II are geographically adjacent regions. An LMR base unit 2 communicates with mobile unit 4 at a frequency $f_1$. Similarly, an LMR base unit 6 communicates with a mobile unit 8 at a frequency $f_2$. Since frequencies $f_1$ and $f_2$ may be spectrally adjacent, base unit 2 may "splatter" into the channel used by base unit 6 and mobile unit 8, resulting in ACI. The same situation can occur between mobile units communicating on spectrally adjacent frequencies. It is to be noted that this problem of ACI occurs between frequency bands assigned to mobile to base communication and base to mobile communications. However, there is no such interference between the 2 directions of communication when both are in operation simultaneously due to adequate frequency separation.

Figure 2A:
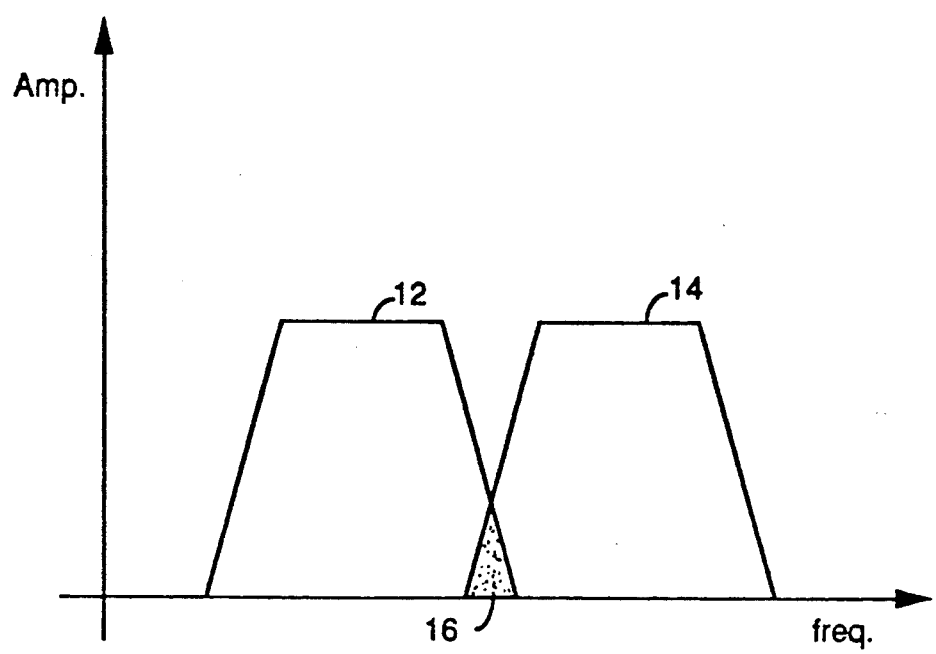
FIG. 2a is a diagram of overlapping frequency spectra of two adjacent channel LMR transmitted signals confined to a limited bandwidth.

FIG. 2a is a diagram of frequency spectra 12 and 14 of two LMR transmitted signals. Spectrum 12 overlaps spectrum 14 causing ACI 16.

Figure 2B:
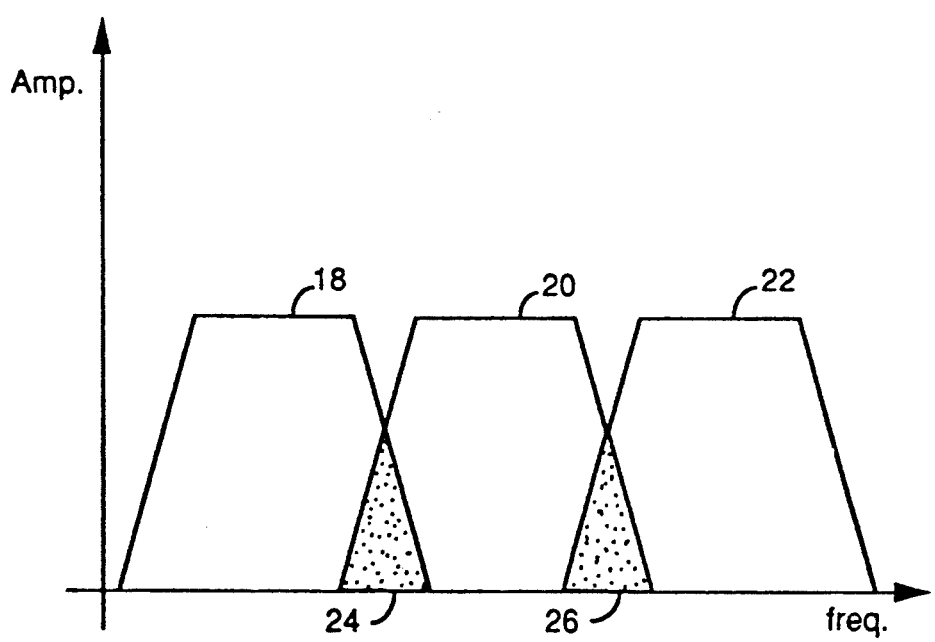

FIG. 2b is a diagram of LMR spectra 18, 20, 22 of three signals in the same bandwidth as FIG. 2a. The overlap between channels 18 and 20 creates ACI 24. The overlap between channels 20 and 22 creates ACI 26. It can be seen that the area of ACI 24 and 26 are much larger than ACI area 16 of FIG. 2a. FIGS. 2a and 2b indicate that as the number of channels within a limited frequency band increases, the amount of ACI also increases, other factors being equal. In order for LMR systems to perform reliably, a transmission scheme must be used that reduces the ACI.

Figure 3:
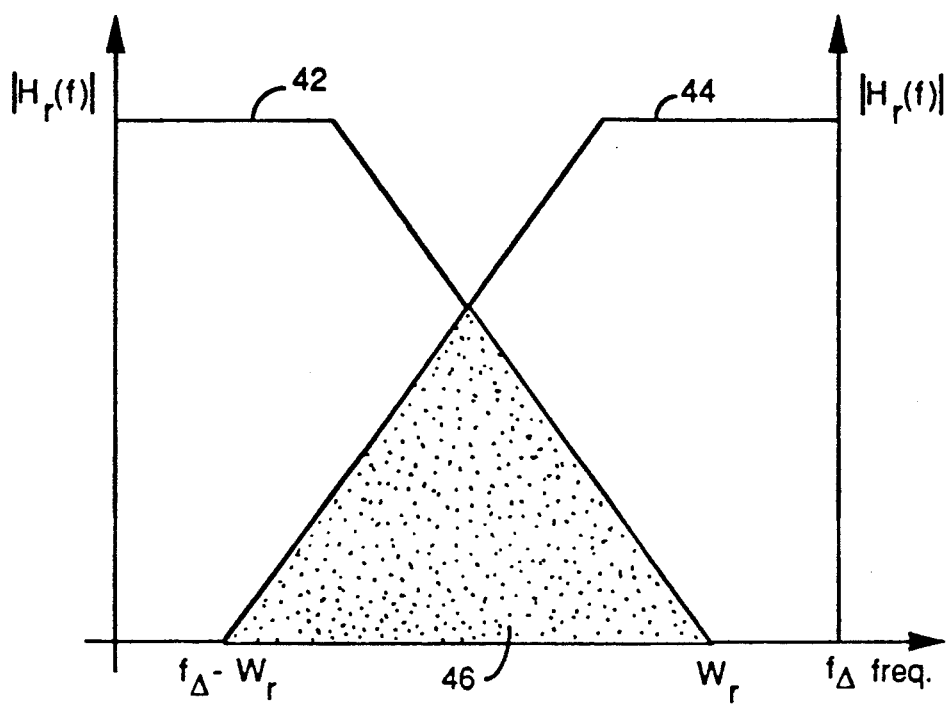
FIG. 3 is a partial diagram of the frequency spectrum of two adjacent channel LMR transmitted signals.

FIG. 3 shows a frequency window 42 in which a receiver employed in a prior art system would receive signals, along with the spectrum of a transmitted signal 44 in an adjacent band that partially overlaps the receive window 42 and is received by the receiver as an interference signal 46. Interference signal 46 represents interference introduced by the adjacent band transmitted signal 44. An adjacent channel interference protection ratio (ACIPR) of this system is defined as:

$$ACIPR = \frac{P_{ib}}{P_{ab}} - \frac{C}{I} \text{ in dB} \qquad (1)$$

where $P_{ib}$ is the desired in-band power, being the power of the transmitted signal within receive window 42, and $P_{ab}$ is the adjacent band power, being the power of the interference signal within receive window 42. For most practical digital modulation schemes, the achievable ACIPR is limited by $P_{ib}/P_{ab}$ rather than C/I. C/I is the carrier to interference ratio, which allows only moderate increases in ACIPR. The conventional schemes do not attempt to improve the ACIPR through proper design of the transmitted signal, which could increase $P_{ib}/P_{ab}$ and potentially yield much larger values of ACIPR. It may also be noted that having improved $P_{ib}/P_{ab}$ we may also use the techniques, described earlier, to lower C/I and thereby improve ACIPR further.

Figure 4A:
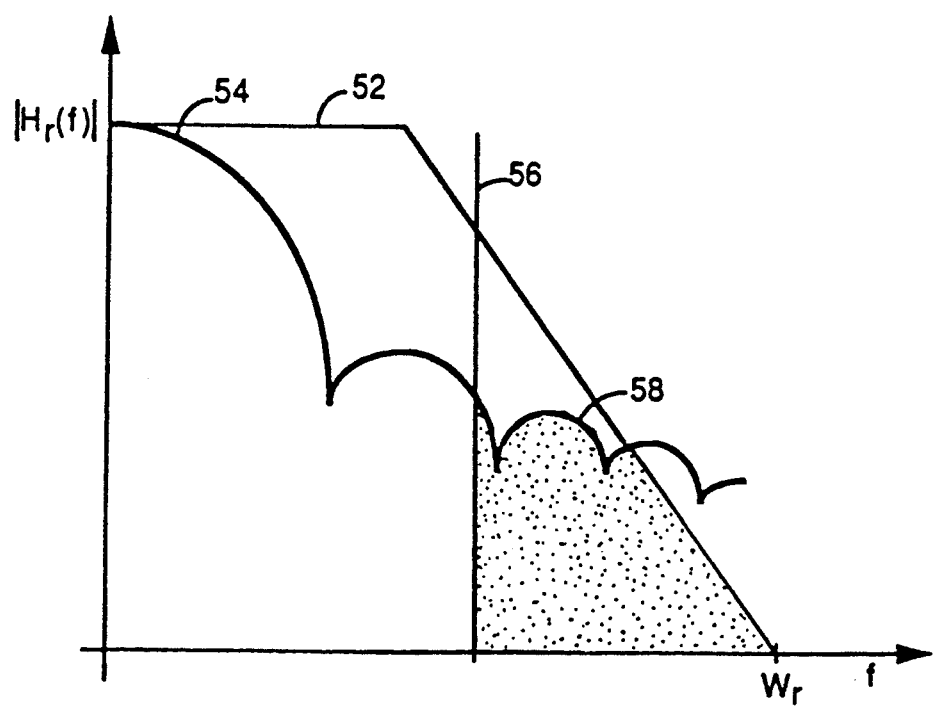
FIG. 4a is a diagram of a frequency spectrum of a transmitted signal superimposed on an idealized receive filter magnitude response (receive window).

The conventional communication techniques described in the "Background of the Invention", except for transmitter power control, are based on reducing the receiver sensitivity (C/I). In FIG. 4a the frequency spectrum of a transmitted signal 54 is shown superimposed on a receive window 52. At a frequency 56, the signal 54 begins to overlap with an adjacent signal. Signal 58 which lies to the right of frequency 56 is introduced as interference in an adjacent channel.

Figure 4B:
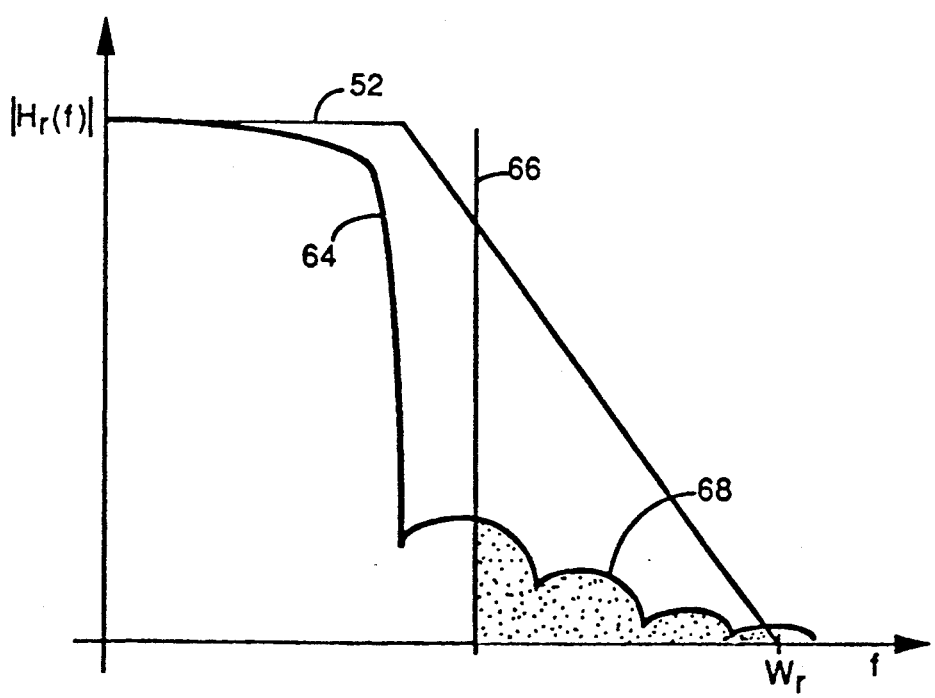

In FIG. 4b, a spectrum of a transmitted signal 64 is shown superimposed in a receive window 52 which is the same as receive window 52 of FIG. 4a. At a frequency 66, signal 64 begins to overlap with adjacent signals. Interference signal 68 is outside the channel. Comparing signal 64 of FIG. 4b and signal 54 of FIG. 4a, it is observed that signal 64 of FIG. 4b has a greater percentage of its energy concentrated inside the desired channel. The shaping of the transmitted spectrum of signal 64 allows for a greater in-band to adjacent band power ratio ($P_{ib}/P_{ab}$). ACIPR, as described by equation (1), is limited by the ratio of in-band to adjacent band power ($P_{ib}/P_{ab}$). The shaping of the signal spectrum also allows signal 64 of FIG. 4b to produce a smaller percentage of interference 68 in an adjacent channel, as opposed to the interference 58 of FIG. 4a.

Figure 5:
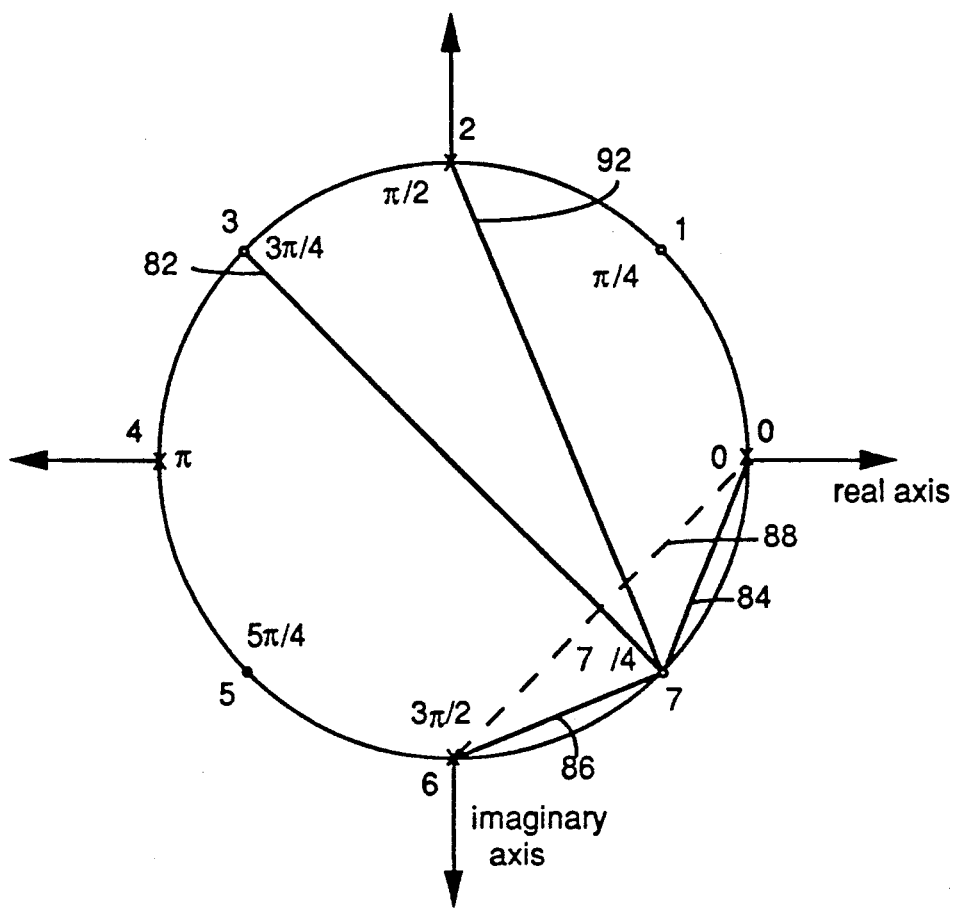
FIG. 5 is an illustration of an eight symbol signal constellation with theoretical symbol transitions superimposed upon it.

In FIG. 5 a signal constellation is shown having eight signal states indicated by symbols 0 through 7. Each symbol is represented by a phase angle. If the last symbol sent by a transmitter was symbol 7, the phase angle is currently at $7\pi/4$ radians. If the next symbol to be sent is symbol 3, the phase angle must change by a $\pi$ radian in the amount of time allocated for the next symbol ($T_s$). Since the period allocated for each transition from one symbol to the next is fixed at $T_s$, the change in phase angle with respect to time ($d\theta/dt$) is dependent upon the difference of phase angles from one symbol to the next transmitted symbol since:

$$f = \frac{d\theta}{dt} \qquad (2)$$

The change in phase angle $\theta$ with respect to time t determines the spectrum of a transmitted signal. If large phase angle changes are allowed, the spectrum of the transmitted signal would be very wide. Conversely by limiting the phase angle transitions, the spectrum of the transmitted signal can be narrowed. In this case the transition from symbol 7 to symbol 3 via transition 82 would result in a $\pi$ radian phase angle change. A transition from symbol 7 to symbol 6 as shown by line 86 results in a $\pi/4$ radian phase angle change. Similarly, transition 84 from symbol 7 to symbol 0 also allows for a $\pi/4$ radian phase angle change. A transition from symbol 6 to symbol 0 allows for a $\pi/2$ radian phase angle change. By not allowing large phase angle transitions, such as transitions 82 and 92, and only allowing small transitions such as 84, 86 and 88, the spectrum of the transmitter may be narrowed. A signal constellation must be used which has a number of extra symbols over the number of symbols intended to be transmitted. This allows encoding of a number of symbols, while avoiding phase angle transitions which would result in a larger frequency spectrum.

Figure 6:
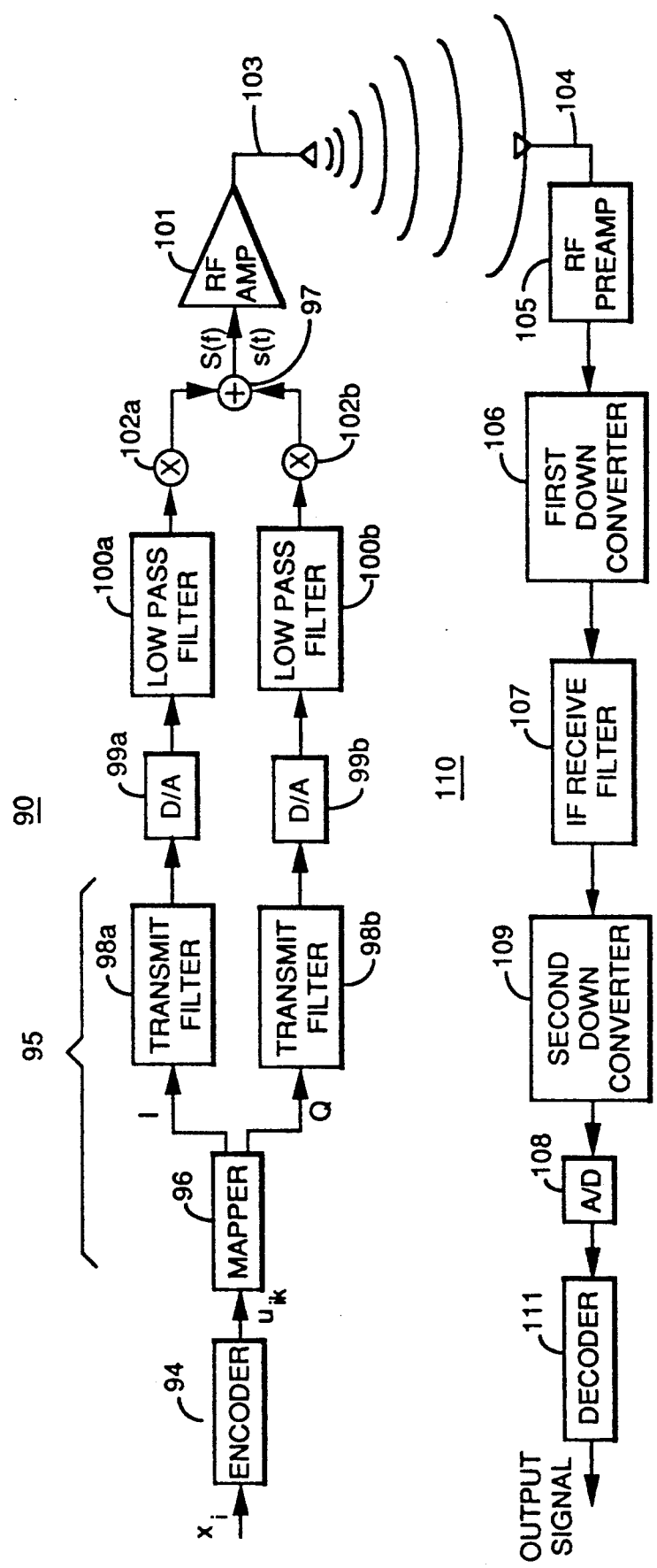
FIG. 6 is a simplified block diagram of a communication system employing the present invention.

A simplified block diagram of a communication system embodying the invention is shown in FIG. 6. A sequential signal $x_i$ (i=0, 1, 2 ...) desired to be transmitted is introduced into an encoder 94 of a transmitter 90. The input signal $x_i$ may be a digital signal or an analog signal which has been digitized. Encoder 94 transforms input signal $x_i$ to an encoded signal which is passed to a mapper 96. Mapper 96 maps the encoded signal onto a symbol of a signal constellation $c_i$ (i=1,2,3...), such as a phase shift keyed signal constellation (FIG. 5). This signal may be represented by its in-phase (I) and quadrature (Q) components which are passed through parallel processing branches. Each of these signals is passed through transmit filters 98a, 98b, D/A converters 99a, 99b, and low pass filters 100a, 100b, and is frequency shifted by quadrature modulators 102a, 102b and finally mixed by a summer 97. The signal from summer 97 is then sent to an rf amplifier 101 which increases the gain of the signal. The rf amplifier passes the amplified signal to an antenna 103 which transmits to a second antenna 104 at a receiver 110. The received signal is passed through an RF preamplifier 105 to a first down converter 106 which reduces the frequency of the received signal in the MHz. range to an intermediate frequency signal in the kHz. range. The intermediate frequency signal is passed to an intermediate frequency receive filter 107, then through a second down converter 109 to produce a filtered baseband signal. The filtered baseband signal is digitized by an analog-to-digital converter 108 and passed to a decoder 111 which processes the digitized baseband signal to recover the transmitted signal information.

Properly designed trellis codes can be generated by encoder 94 and mapper 96 to improve the ratio of in-band to adjacent power ($P_{ib}/P_{ab}$). This is because trellis codes can be designed to have a very compact power spectrum. The compact spectrum is achieved by using encoder 94 to introduce correlation between input signals $x_i$ and mapper 96 to appropriately map these correlated symbols $c_i$ onto a modulation signal constellation. The mapping is optimized in a manner to avoid sudden phase transitions and thereby keeps the spectrum constrained within a given frequency band.

The ACIPR expression given by equation (1) can be expanded as follows:

$$ACIPR = \frac{\int_{-W_r}^{W_r} H_r(f)S(f)df}{\int_{-W_r}^{W_r} H_r(f)(S(f-f_\Delta) + S(f+f_\Delta))df} - \frac{C}{I} \text{ (in dB)} \quad (3)$$

where S(f) is the transmitted signal power spectrum at antenna 103, $H_r(f)$ is the magnitude squared frequency response of receive filter 107 whose one-sided bandwidth is $W_r$, and $f_\Delta$ is the frequency separation between the desired channel and adjacent channel. It should be noted that C/I determines the bit error rate (BER) through the minimum Euclidean distance between the transmitted symbols. In equation (3) we have assumed there are adjacent interfering channels on either side of the desired channel as shown in FIG. 2b. The advantage of this formulation, as explained later, is to obtain a symmetrical transmitted signal power spectrum.

The motivation for spectral shaping to improve ACIPR is better understood by expanding S(f) into its component terms. Transmitter 90 can be modeled by encoder 94 followed by a linear modulator 95 comprised of mapper 96 followed by transmit filters 98a, 98b. The encoder 94 is modeled as a finite-state sequential machine with N possible states {1, 2, ..., N}, comprising a shift register followed by mapper 96. Encoder 94 is fed with an input signal being a sequence of stationary independent and identically distributed symbols {0, 1, ..., M−1}, which may be non-binary. The output of encoder 94 passes through mapper 96 to produce a coded symbol sequence {$c_i$} which is shaped by the transmit filters. The resulting output signal can be represented as:

$$s(t) = \sum_{i=-\infty}^{\infty} c_i q(t - iT_s) \quad (4)$$

where q(t) represents the impulse response of the transmit filters 98a, 98b with frequency response Q(f), and $T_s$ is the symbol duration.

The power spectrum of s(t), denoted by S(f), can be decomposed into a continuous part and a discrete part (line spectrum). The discrete part vanishes when the output symbols have zero mean. Under this condition S(f) can be expressed as $$S(f) = \quad (5)$$

$$\frac{|Q(f)|^2}{T_s}\left\{A + 2Re\left[U^H B\left[\sum_{v=0}^{\infty} e^{-j2\pi(v+1)T_s} C^v\right]DU\right]\right\},$$

where A, B, C and D are constant matrices that are functions of the state transition matrices, probability transition matrix, stationary state probabilities and input symbol probabilities. U is the vector of coded symbols represented by:

$$U = [u_{0,1} u_{0,2} \ldots u_{0,N} u_{1,1} \ldots u_{M-1,N}]^T \quad (6)$$

where $u_{i,k}$ is the symbol at the output of encoder 94 when it is in state k and the input is symbol i. The superscripts H and T represent the conjugate transpose and transpose operators respectively.

For the case of equally likely input symbols being sent to the shift register encoder, equation (5) can be written in the form:

$$S(f) = \frac{|Q(f)|^2}{MNT_s} U^H \Bigg[ I + \quad (7)$$

$$\frac{1}{M} \sum_{v=0}^{L-1} X_v \cos(2\pi f(v+1))T_s + jY_v \sin(2\pi f(v+1))T_s \Bigg] U$$

where M=input alphabet size, N=number of encoder states, L=memory length of the shift register encoder, and $$X_\mu = A_\mu^T + A_\mu, \quad Y_\mu = A_\mu^T - A_\mu$$

$$A_\mu = E(P^\mu - P^\infty)J^T$$

where P is the transition probability matrix of the finite-state encoder, $P^\infty$ is a matrix of stationary state probabilities (in the above case, due to equally likely input symbols, all the elements of the matrix equal 1/N), and J is a matrix $$J^T = [I\ I\ \ldots\ I] \text{ repeated M times}$$

where I is the identity matrix.

The matrix E is given by:

$$E = [E_0^T E_1^T \ldots E_{M-1}^T]$$

where the elements of the matrices $E_m$, m=0,1, ... M−1 are defined as follows:

$$(E_m)_{i,k} = \begin{cases} 1 & \text{if input } m \text{ takes encoder from state } i \text{ to state } k \\ 0 & \text{otherwise.} \end{cases}$$

Finally, the transition probability matrix P, for equally likely input symbols, is:

$$P = \frac{1}{M} \sum_{m=0}^{M-1} E_m.$$

Now, from equation (7) we can write the transmitted spectrum as:

$$S(f) = \frac{|Q(f)|^2}{T_s} E(f) \quad (8)$$

where E(f) is the power spectral contribution due to the encoder:

$$E(f) = \frac{1}{MN} U^H \Bigg[ I + \quad (9)$$

$$\frac{1}{M} \sum_{v=0}^{L-1} X_v \cos(2\pi f(v+1)T_s) + jY_v \sin(2\pi f(v+1)T_s) \Bigg] U$$

Now, using equations (1), (3) and (7) the ratio of power in band to power out of band is:

$$\frac{P_{ib}}{P_{ab}} = \quad (10)$$

-continued $$\frac{\int_{-W_r}^{W_r} |Q(f)|^2 E(f) H_r(f) df}{\int_{-W_r}^{W_r} [|Q(f-f_\Delta)|^2 E(f-f_\Delta) + |Q(f+f_\Delta)|^2 E(f+f_\Delta)] H_r(f) df}$$

It is seen from equation (10) that the ACIPR can be controlled by spectrally shaping the transmitted signal $|Q(f)|^2 E(f)$ using an encoder of the form described above and a suitably chosen transmit filter. The present invention takes into account the spectral characteristics $H_r(f)$ of receive filter 107 in its optimization, allowing shaping of the transmitted signal in a manner to achieve the best power distribution within its band (window), and thereby maximizes ACIPR. In equation (10), as in equation (3), interference is introduced from an adjacent channel on each side of the desired channel. If only a single interfering channel were used in equations (3) and (10), the optimum transmitted signal power spectrum $|Q(f)|^2 E(f)$ would tend to be asymmetrical. Hence, in a practical system, the gain in $P_{ib}/P_{ab}$ with respect to one adjacent channel will be at the expense of a lower $P_{ib}/P_{ab}$ for the other adjacent channel. The two (symmetrical) adjacent interfering channels formulation, as described in equations (3) and (10), alleviates this problem.

Figure 7:
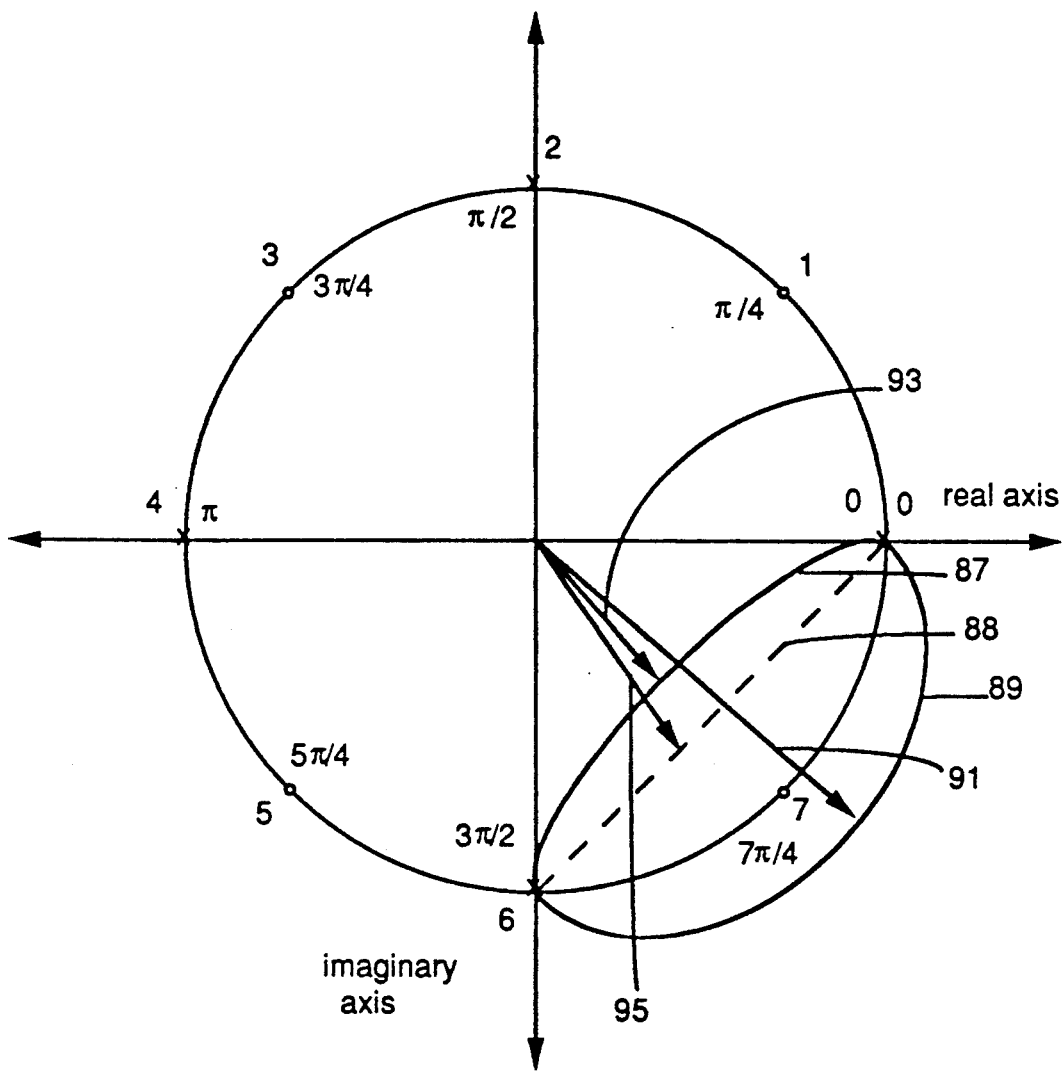
FIG. 7 is an illustration of the eight symbol signal constellation of FIG. 5 with actual symbol transitions superimposed upon it.

FIG. 7 illustrates a phase transition from symbol 6 to symbol 0 and vice versa. Theoretically, the transition from symbol 6 to symbol 0 should follow the dashed line 88. In real systems, however, a transition from symbol 6 to symbol 0 follows either a path 87 or a path 89. Paths 89 and 87 differ from path 88 due to the characteristics of the transmit filter 98 and mapper 96 of FIG. 7. The maximum power required for transition 89 is shown by arrow 91. The minimum power required for transition 87 is indicated by an arrow 93. By determining the maximum power $P_{peak}$ required for all symbol transitions and a minimum power required for all symbol transitions, an average power per symbol $P_{ave}$ may be determined. Arrow 95 illustrates an approximate average power. After the average power has been calculated, the ratio of peak power to average power may then be determined.

Figure 8:
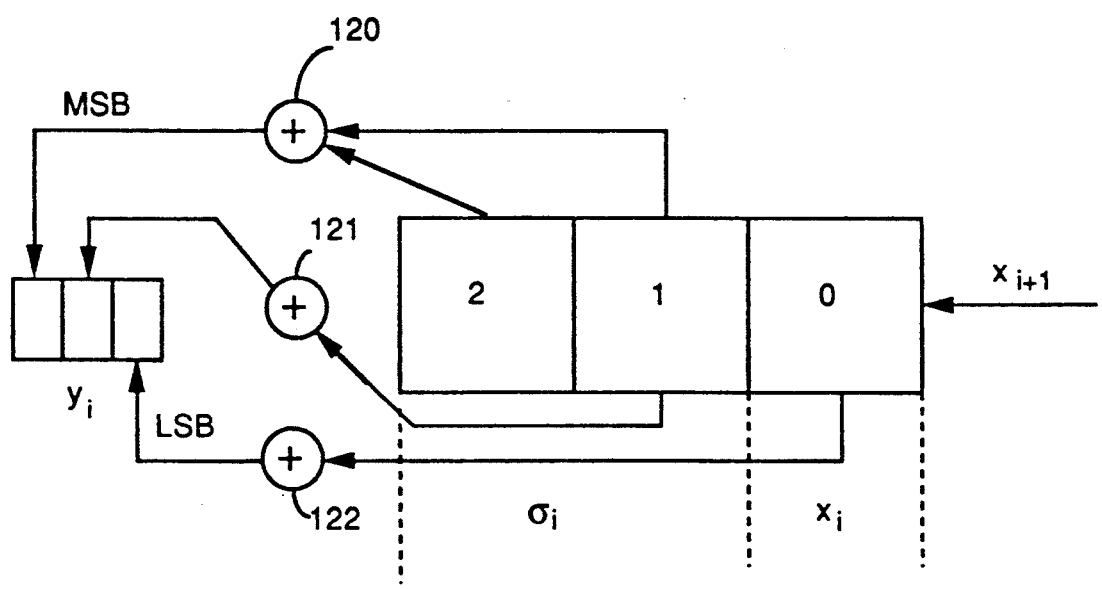
FIG. 8 is a block diagram of a Rate ⅓ convolutional encoder with memory length L=2 having three generators polynomials represented in octal notation as: (6, 2, 1).

FIG. 8 is a schematic diagram of an encoder which creates three output bits for a single input bit, $x_i$. This is known as a rate $\frac{1}{3}$ encoder. It has two memory registers of length L=2, each for holding a bit, and an input register for receiving an input bit $x_i$. Registers in the encoder are numbered from right to left 0, 1, 2. A generator polynomial is a binary multiplier which selects the contents of registers and adds them modulo 2 to create an output bit. There is one generator polynomial for each output bit. For the encoder of FIG. 8 there are three generators. The first generator 120 adds the contents of registers 2 and 1 but not register 0. This generator is denoted by a binary 110 or an octal 6. The second generator 121 is represented by a binary 010 or octal 2, and the third generator 122 is represented by a binary 001 or an octal 1. In short notation the generator of FIG. 8 are (6, 2, 1).

Registers 1 and 2 determine the state of the encoder, $\sigma_i$. In general terms for a k/n encoder having a memory of length L, a present symbol $y_y$, is completely determined by the input symbol $x_i$, made up of the k most recent bits, and the convolutional encoder state, $\sigma_i$, denoting the remaining L bits.

A linear shift register encoder was used only for illustrative purposes. (The type of encoder employed in the present invention is not limited to linear shift register encoders or linear encoders. Many types of encoder which satisfy the present disclosure may be used.)

Spectral efficiency can be increased by trading power for bandwidth. The loss in power results in a range reduction, a serious problem. For digital transmission, range is a function of acceptable BER performance. The BER performance is affected by average transmit power and minimum distance of the code. If the transmission is peak power constrained then the BER will also depend upon the peak-to-average transmit power ratio.

The trellis codes described herein preclude interleaving of code symbols. Hence, in a mobile radio channel the fading will be correlated over several symbol periods, and it is the minimum distance of the code that will determine bit error rate (BER) performance. The minimum distance between coded sequences, $d_{min}^2$, can be calculated as described by Biglieri et al. in *Introduction to Trellis Coded Modulation with Applications* published by MacMillan Publishing Co., New York, N.Y. 1991 at pages 527–539, hereby incorporated by reference.

The proposed trellis codes have a non-constant envelope and require the use of a linear power amplifier. In this situation it is desirable for the transmitted signal to have a small peak-to-average ($P_{peak}/P_{ave}=P_r$) power variation. This relaxes the linearization requirements on the power amplifier. Further, for a given peak power rating, a higher average power increases range. Alternately, it can be viewed as power saving for a given range.

From the above discussion it can be seen that it is desirable to select codes with the highest minimum distance $d_{min}^2$ and a low peak-to-average transmit power ratio $P_r$. The $P_r$ is influenced by the transmit filter characteristics and the code set chosen.

The transmission is assumed to be peak power constrained as discussed above. The minimum distance $d_{min}^2$ and peak-to-average transmit power ($P_r$) will be used as criteria to select codes. A convenient criterion for code selection can be derived from these two parameters. Towards this end the parameter $P_{DR}=d_{min}^2/P_r$ is defined and used to select codes. $P_{DR}$ could be normalized by a corresponding $P_{DR}$ of some reference modulation scheme and used to select codes. The reference modulation scheme is compared with the present invention to indicate how well it performs. For convenience, the invention is described in terms of the non-normalized case.

The present invention employs encoder 94 using trellis coded modulation and appropriately designed transmit filter 98 having frequency response Q(f) and receive filter 107 having an power spectrum $H_r(f)$ to achieve high spectral efficiency. In the LMR system, this objective can be realized by using equations (3) and (11) as optimization functions.

Assumptions must be made in order to complete the optimization. A optimization procedure to select appropriate codes is described below.

1. Construct a transmitter having an encoder with a memory length L and capable of being in a plurality of encoder states connected to a mapper that is connected to two parallel branches, each branch having a transmit filter with a transfer function Q(f), a digital-to-analog converter, a low pass filter and a modulator connected in series, both modulators being connected to a summer, the summer serially connected to an rf amplifier and a transmit antenna;

2. construct a receiver having a receive antenna, an rf preamplifier, a first down converter, a receive filter having a power spectrum $H_r(f)$, a second down converter, an analog-to-digital converter and a decoder serial connected;

3. choose a desired minimum $P_{DR}$ value (MPDR) where $P_{DR}$ is defined as:

$$P_{DR} = \frac{d_{min}^2}{P_r} = d_{min}^2 \left( \frac{P_{ave}}{P_{peak}} \right)$$

where $P_{ave}$ is an average power signal transmitted from the transmit antenna, $P_{peak}$ is the peak power of the transmitted signal, and $d_{min}$ is a minimum Euclidean distance associated with an encoder set;

4. choose a symbol period, $T_s$;

5. choose a number of input bits to be shifted into the encoder at each symbol period thereby to determining the encoder alphabet having M entries;

6. choose a number of bits to be output by the encoder during each symbol period to determine a length of an encoder output code and a number of constellation points;

7. set a probability associated with each encoder alphabet entry to a same predetermined value thereby causing a matrix $X_v$ to become fixed;

8. set a probability associated with each encoder output code to a same predetermined value thereby causing a matrix $Y_v$ to become fixed;

9. permutate all possible encoder states with all encoder alphabet entries to result in a plurality of encoder sets U;

10. choose an encoder set as a present encoder set;

11. adapt the encoder to provide a plurality of encoder output codes u from the present encoder set U according to the encoder's present state and a presently received encoder alphabet entry;

12. calculate $P_{DR}$ associated with the present encoder set U;

13. compare $P_{DR}$ with MPDR, if $P_{DR}$ does not exceed MPDR, the present encoder set U is discarded;

14. repeat steps 10–13 for all encoder sets U;

15. calculate a $P_{ib}/P_{ab}$ ratio for each encoder set that has not been discarded according to the following equation:

$$\frac{P_{ib}}{P_{ab}} = \frac{\int_{-W_r}^{W_r} |Q(f)|^2 E(f) H_r(f) df}{\int_{-W_r}^{W_r} [|Q(f-f_\Delta)|^2 E(f-f_\Delta) + |Q(f+f_\Delta)|^2 E(f+f_\Delta)] H_r(f) df}$$

where $$E(f) = \frac{1}{MN} U^H \left[ I + \right.$$

$$\left. \frac{1}{M} \sum_{v=0}^{L-1} X_v \cos(2\pi f(v+1)T_s) + jY_v \sin(2\pi f(v+1)T_s) \right] U$$

and the superscript H indicates Hermitian or conjugate transpose operator, M=number of input alphabet entries, N=number of encoder states, L=memory length of the shift register encoder, and $T_s$ is the symbol duration;

16. choose an encoder set from the encoder sets that have not been discarded having the greatest $P_{ib}/P_{ab}$ ratio as the optimum coding set;

17. adapt the transmitter to transmit the optimum coding set for all future transmissions;

18. adapt the decoder of the receiver to decode signals it receives according to the optimum coding set.

For a second embodiment, the steps are as follows:

1. Construct a transmitter having an encoder with a memory length L and capable of being in a plurality of encoder states connected to a mapper that is connected to two parallel branches, each branch having a transmit filter with a transfer function Q(f), a digital-to-analog converter, a low pass filter and a modulator connected in series, both modulators being connected to a summer, the summer serially connected to an rf amplifier and a transmit antenna;

2. construct a receiver having a receive antenna, an rf preamplifier, a first down converter, a receive filter having a power spectrum $H_r(f)$, a second down converter, an analog-to-digital converter and a decoder serial connected;

3. choose a desired minimum $P_{ib}/P_{ab}$ power ratio (MPR);

4. choose a symbol period, $T_s$;

5. choose a number of input bits to be shifted into the encoder at each symbol period thereby determining an encoder alphabet having M entries;

6. choose a number of bits to be output by the encoder during each symbol period to determine a length of an encoder output code and a number of constellation points;

7. set a probability associated with each encoder alphabet entry to a same predetermined value thereby causing a probability matrix $X_v$ to become fixed;

8. set a probability associated with each encoder output code to a same predetermined value thereby causing a probability matrix $Y_v$ to become fixed;

9. permutate all possible encoder states with all encoder alphabet entries to result in a plurality of encoder sets U;

10. choose an encoder set as a present encoder set;

11. calculate a $P_{ib}/P_{ab}$ ratio for the present encoder set according to the following equation:

$$\frac{P_{ib}}{P_{ab}} = \frac{\int_{-W_r}^{W_r} |Q(f)|^2 E(f) H_r(f) df}{\int_{-W_r}^{W_r} [|Q(f-f_\Delta)|^2 E(f-f_\Delta) + |Q(f+f_\Delta)|^2 E(f+f_\Delta)] H_r(f) df}$$

where

-continued $$E(f) = \frac{1}{MN} U^H \left[ I + \frac{1}{M} \sum_{v=0}^{L-1} X_v \cos(2\pi f(v+1)T_s) + jY_v \sin(2\pi f(v+1)T_s) \right] U$$

and the superscript H indicates Hermitian or conjugate transpose operator, M=number of input alphabet entries, N=number of encoder states, L=memory length of the shift register encoder, and $T_S$ is the symbol duration;

12. adapt the encoder to provide a plurality of encoder output codes u from the present encoder set U according to the encoder's present state and a presently received encoder alphabet entry;

13. compare MPR with $P_{ib}/P_{ab}$; if $P_{ib}/P_{ab}$ does not exceed MPR, the present encoder set U is discarded;

14. repeat steps 10–13 for all encoder sets U;

15. calculate a $P_{DR}$ value for each encoder set that has not been discarded according to the equation:

$$P_{DR} = \frac{d_{min}^2}{P_r} = d_{min}^2 \left( \frac{P_{ave}}{P_{peak}} \right)$$

where $P_{ave}$ is an average power of a transmitted signal employing an encoder set, $P_{peak}$ is the peak power the transmitted signal employing an encoder set, and $d_{min}$ is a minimum Euclidean distance associated with an encoder set;

16. choose an encoder set from the encoder sets that have not been discarded having the greatest $P_{DR}$ is selected as the optimum coding set;

17. adapt the encoder to output the optimum coding set for all future transmissions;

18. adapt the decoder to decode signals it receives according to the optimum coding set.

Although described for LMR channels, the invention described herein is equally applicable to other spectrally congested channels.

While several presently preferred embodiments of the invention have been described in detail herein, many modifications and variations will now become apparent to those skilled in the art. It is, therefore, to be understood that the appended claims are intended to cover all such modifications and variations as fall within the true spirit of the invention.

What we claim is:

1. A method of configuring a communication system, said system including a transmitter having an encoder with a memory length L and capable of being in a plurality of encoder states coupled to a mapper for mapping the encoder states to a phase angle signal, a pair of parallel branches coupled to an output of the mapper, each branch having a transmit filter coupled to the mapper for filtering the phase angle signal with a transfer function Q(f), a digital-to-analog (D/A) converter coupled to the transmit filter for sampling the filtered signal, a low pass filter and a modulator coupled in series with the D/A converter, a summer coupled to the modulator of each branch, and a transmit antenna coupled to the output of the summer, said system further including; a receiver having a receive antenna, a first down converter, a receive filter having a power spectrum $H_r(f)$, a second down converter, an analog-to-digital converter and a decoder all serially coupled; said method comprising the steps of:

a) choosing a desired minimum acceptable value, (MPDR), of $P_{DR}$ for the transmitter where $P_{DR}$ is defined as:

$$P_{DR} = \frac{d_{min}^2}{P_r} = d_{min}^2 \left( \frac{P_{ave}}{P_{peak}} \right)$$

where $P_{ave}$ is an average power signal transmitted from the transmit antenna, $P_{peak}$ is the peak power of the transmitted signal, and $d_{min}$ is a minimum Euclidean distance associated with an encoder set;

b) choosing a symbol period, $T_S$;

c) choosing a number of input bits to be shifted into the encoder at each said symbol period thereby determining the encoder alphabet having M entries;

d) choosing a number of bits to be output by the encoder during each said symbol period to determine length of an encoder output code and a number of constellation points;

e) setting a probability associated with each said encoder alphabet entry uniformly to a single predetermined value, thereby fixing a probability matrix $X_n$;

f) setting a probability associated with each said encoder output code uniformly to a single predetermined value, thereby fixing a probability matrix $Y_n$;

g) permutating all possible encoder states with all encoder alphabet entries to result in a plurality of encoder sets U;

h) choosing an encoder set as a present encoder set;

i) adapting the encoder to provide a plurality of encoder output codes u from the present encoder set U according to the encoder's present state and a presently received encoder alphabet entry;

j) determining $P_{DR}$ associated with the present encoder set U;

k) comparing $P_{DR}$ determined from step "j" with MPDR, and discarding the present encoder set U if $P_{DR}$ does not exceed MPDR;

l) repeating steps "h"–"k" for all encoder sets U;

m) determining a $P_{ib}/P_{ab}$ ratio for each encoder set that has not been discarded according to the following equation:

$$\frac{P_{ib}}{P_{ab}} = \frac{\int_{-W_r}^{W_r} |Q(f)|^2 E(f) H_r(f) df}{\int_{-W_r}^{W_r} [|Q(f-f_\Delta)|^2 E(f-f_\Delta) + |Q(f+f_\Delta)|^2 E(f+f_\Delta)] H_r(f) df}$$

where $$E(f) = \frac{1}{MN} U^H \left[ I + \frac{1}{M} \sum_{v=0}^{L-1} X_v \cos(2\pi f(v+1)T_s) + jY_v \sin(2\pi f(v+1)T_s) \right] U$$

and the superscript H indicates Hermitian or conjugate transpose operator, M=number of input alphabet entries, N=number of encoder states, L=memory length of the shift register encoder, and $T_s$ is the symbol duration;

n) choosing from the encoder sets that have not been discarded an encoder set having the greatest $P_{ib}/P_{ab}$ ratio as the optimum coding set;

o) adapting the transmitter to transmit the optimum coding set for all future transmissions; and p) adapting the decoder to decode signals it receives according to the optimum coding set.

2. A method of configuring a communication system, said system including a transmitter having an encoder with a memory length L and capable of being in a plurality of encoder states coupled to a mapper for mapping the encoder states to a phase angle signal, a pair of parallel branches coupled to an output of the mapper, each branch having a transmit filter coupled to the mapper for filtering the phase angle signal with a transfer function Q(f), a digital-to-analog (D/A) converter coupled to the transmit filter for sampling the filtered signal, a low pass filter and a modulator coupled in series with the D/A converter, a summer coupled to the modulator of each branch, and a transmit antenna coupled to the output of the summer, said system further including; a receiver having a receive antenna, a first down converter, a receive filter having a power spectrum $H_r(f)$, a second down converter, an analog-to-digital converter and a decoder all serially coupled; said method comprising the steps of:

a) choosing a desired minimum acceptable value, (MPR), of power ratio $P_{ib}/P_{ab}$;

b) choosing a symbol period, $T_s$;

c) choosing a number of input bits to be shifted into the encoder at each said symbol period thereby determining an encoder alphabet having M entries;

d) choosing a number of bits to be output by the encoder during each said symbol period to determine length of an encoder output code and a number of constellation points;

e) setting a probability associated with each said encoder alphabet entry uniformly to a single predetermined value thereby fixing a probability matrix $X_n$;

f) setting a probability associated with each encoder output code uniformly to a single predetermined value thereby fixing a probability matrix $Y_n$;

g) permutating all possible encoder states with all said encoder alphabet entries to result in a plurality of encoder sets U;

h) choosing an encoder set as a present encoder set;

i) calculating a $P_{ib}/P_{ab}$ ratio for the present encoder set that has not been discarded according to the following equation:

$$\frac{P_{ib}}{P_{ab}} = \frac{\int_{-W_r}^{W_r} |Q(f)|^2 E(f) H_r(f) df}{\int_{-W_r}^{W_r} [|Q(f - f_\Delta)|^2 E(f - f_\Delta) + |Q(f + f_\Delta)|^2 E(f + f_\Delta)] H_r(f) df}$$

where

-continued $$E(f) = \frac{1}{MN} U^H \left[ I + \frac{1}{M} \sum_{v=0}^{L-1} X_v \cos(2\pi f(v+1)T_s) + jY_v \sin(2\pi f(v+1)T_s) \right] U \text{ and}$$

the superscript H indicates Hermitian or conjugate transpose operator, M=number of input alphabet entries, N=number of encoder states, L=memory length of the shift register encoder, and $T_s$ is the symbol duration;

j) adapting the encoder to provide a plurality of encoder output codes u from the present encoder set U according to the encoder's present state and a presently received encoder alphabet entry;

k) comparing MPR with $P_{ib}/P_{ab}$, calculated in step "i" and discarding the present encoder set U if $P_{ib}/P_{ab}$ does not exceed MPR;

l) repeating steps "h"–"k" for all encoder sets U;

m) determining a $P_{DR}$ value for each encoder set that has not been discarded according to the equation:

$$P_{DR} = \frac{d_{min}^2}{P_r} = d_{min}^2 \left( \frac{P_{ave}}{P_{peak}} \right)$$

where $P_{ave}$ is an average power of a transmitted signal employing an encoder set, $P_{peak}$ is the peak power of the transmitted signal employing an encoder set, and $d_{min}^2$ is a minimum Euclidean distance associated with an encoder set;

n) choosing an from the encoder sets that have not been discarded an encoder set having the greatest $P_{DR}$ is selected as the optimum coding set;

o) adapting the transmitter to transmit the optimum coding set for all future transmissions; and p) adapting the decoder of the receiver to decode signals it receives according to the optimum coding set.

3. The method of configuring a communication system as recited in claim 2 wherein the step of determining a $P_{DR}$ value further comprises calculating the peak to average power ratio according to the steps of:

a) choosing a test encoder set from the encoder sets that have not been discarded;

b) adapting the encoder to provide a plurality of encoder output codes u from the test encoder set according to the encoder's present state and a presently received encoder alphabet entry;

c) providing a test set of encoder alphabet entries to the encoder, causing the encoder to produce said output codes;

d) passing the output codes though the mapper to obtain a pair of symbol phase angles that are shifted 90 degrees with respect to each other;

e) filtering each of the phase angles with one of the transmit filters;

f) creating an analog signal from the filtered phase angles;

g) low pass filtering each analog signal;

h) modulating the low pass filtered analog signals;

i) mixing the low pass filtered analog signals to create a mixed signal; and j) measuring the peak and average powers of the mixed signal

* * * * *